(12) United States Patent
Wu et al.

(10) Patent No.: US 7,233,060 B2
(45) Date of Patent: Jun. 19, 2007

(54) MODULE CARD STRUCTURE

(75) Inventors: Kevin Wu, Hsinchu Hsien (TW); Roy Lin, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 11/066,525

(22) Filed: Feb. 23, 2005

(65) Prior Publication Data

US 2006/0186518 A1    Aug. 24, 2006

(51) Int. Cl.
*H01L 23/02* (2006.01)
*H01L 23/48* (2006.01)
*H01L 23/52* (2006.01)
*H01L 29/40* (2006.01)

(52) U.S. Cl. .................. 257/685; 257/738; 257/778; 257/783

(58) Field of Classification Search ........ 257/737–738, 257/777–795, 685–687
See application file for complete search history.

(56) References Cited

U.S. PATENT DOCUMENTS

| | | | | |
|---|---|---|---|---|
| 5,564,617 A | * | 10/1996 | Degani et al. | 257/E21.511 |
| 6,650,009 B2 | * | 11/2003 | Her et al. | 257/738 |
| 6,924,171 B2 | * | 8/2005 | Buchwalter et al. | 438/106 |

* cited by examiner

*Primary Examiner*—Cuong Nguyen
(74) *Attorney, Agent, or Firm*—Pro-Techtor Int'l Services

(57) ABSTRACT

A module card structure includes a structure, a first chip, a second chip, an adhesive layer, and a compound layer. The substrate has an upper surface on which a plurality of golden fingers are formed, and a lower surface. The first chip is mounted on the upper surface of the substrate and is electrically connected to the golden fingers by first wires. The second chip is adhered to the upper surface of the substrate by the adhesive layer, which includes glue and filling elements, and is electrically connected to the golden fingers by second wires. The compound layer is encapsulated on the first chip and the second chip.

2 Claims, 2 Drawing Sheets

MODULE CARD STRUCTURE

BACKGROUND OF THE INVENTION

1. Field of the Invention

The invention relates to a module card structure, and in particular to a module card structure, which is light, thin, and small.

2. Description of the Related Art

Referring to FIG. 1, a conventional module card structure includes a substrate 10, a first chip 18, a second chip 22, and a compound layer 26.

The substrate 10 has an upper surface 12 on which a plurality of golden fingers 16 are formed, and a lower surface 14. The first chip 18 is mounted on the upper surface 12 of the substrate 10, and is electrically connected to the golden fingers 16 of the upper surface 12 of the substrate 10 by wires 20. Please refer to FIG. 2, the second chip 22 is mounted on the upper surface 12 of the substrate 10 and is electrically connected to the golden fingers 16 of the upper surface 12 of the substrate 10 by wires 24. The compound layer 26 is encapsulated on the first chip 18 and the second chip 22.

Accordingly, a large gap for wire bonding between the first chip 18 and the second chip 22 is formed so that the structure has a large size. Therefore, the size of the substrate 10 has to be large in order to enlarge the space for wire bonding.

SUMMARY OF THE INVENTION

An object of the invention is to provide a module card structure, which can be easily packaged and is capable of reducing the volume of the structure and the manufacturing cost.

Another object of the invention is to provide a module card structure capable of packaging chip having different sizes without changing the package volume. The object of the producing structures having the same volume can be achieved.

To achieve the above-mentioned object, the invention provides a module card structure including a substrate, a first chip, a second chip, an adhesive layer, and a compound layer. The substrate has an upper surface on which a plurality of bonding pads and a plurality of golden fingers are formed, and a lower surface. The first chip is mounted on the upper surface of the substrate and is electrically connected to the golden fingers by first wires. The second chip is adhered to the upper surface of the substrate by the adhesive layer, which includes glue and filling elements, and is electrically connected to the golden fingers by second wires. The adhesive layer partially covers and contacts each of the bonding pads to expose and exposed portion of each of the bonding pads, and the first wires are respectively bonded to the exposed portions of the bonding pads. The compound layer is encapsulated on the first chip and the second chip.

DETAILED DESCRIPTION OF THE INVENTION

Figure 1:
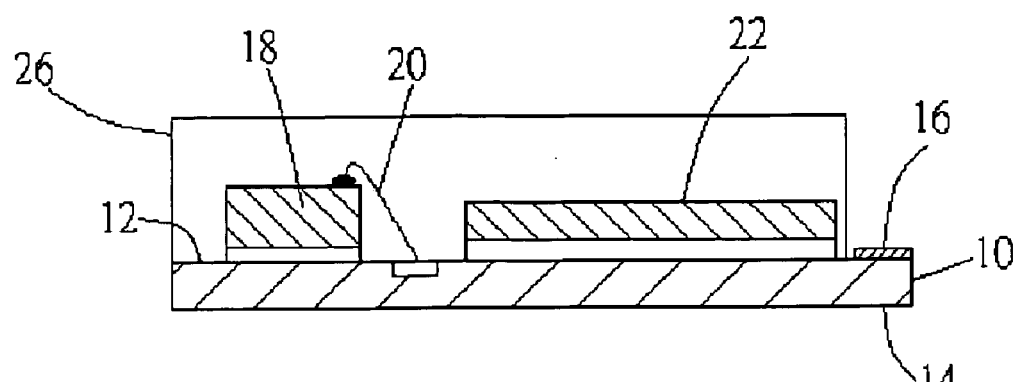
FIG. 1 is a schematic illustration showing a conventional module card structure.
Figure 2:
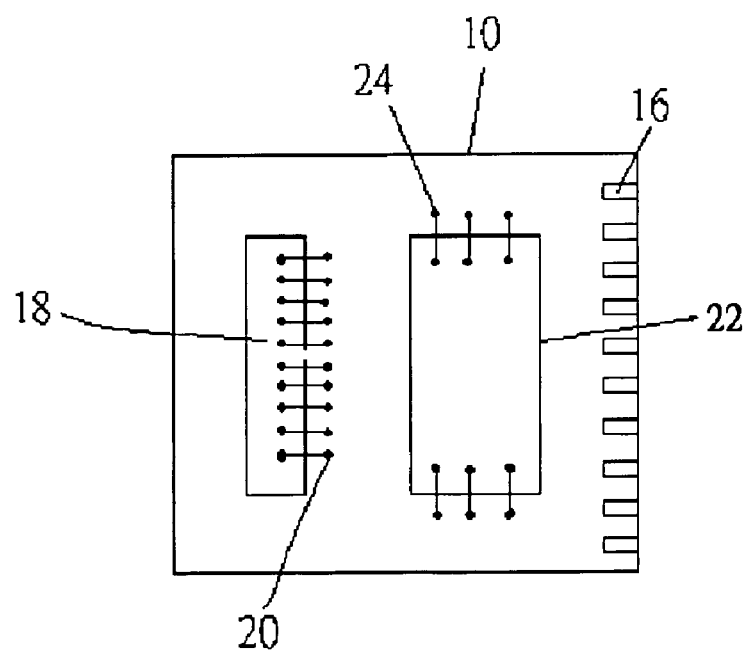
FIG. 2 is a top view of the FIG. 1.
Figure 3:
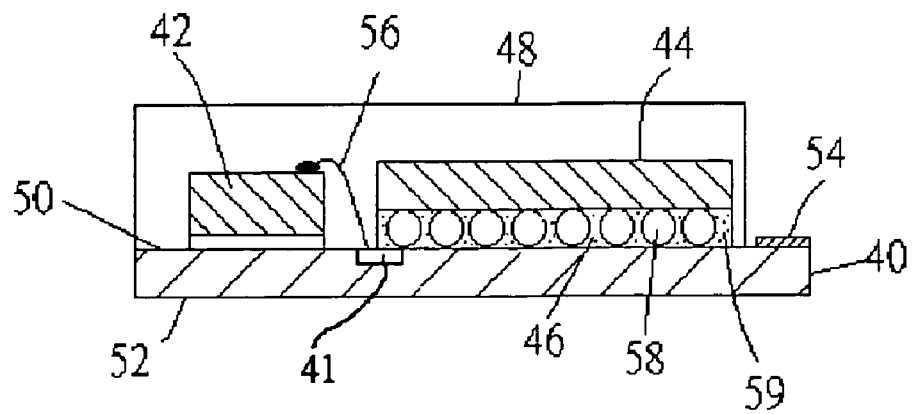
FIG. 3 is a schematic illustration showing a module card structure of the present invention.

Please refer to FIG. 3, a module card structure of the present invention includes a substrate 40, a first chip 42, a second chip 44, an adhesive layer 46, and a compound layer 48.

The substrate 40 has an upper surface 50 on which a plurality of golden fingers 54 and bonding pads 41 are formed, and a lower surface 52.

The first chip 42 is mounted on the upper surface 50 of the substrate 40 and is electrically connected to the golden fingers 54 by first wires 56.

Figure 4:
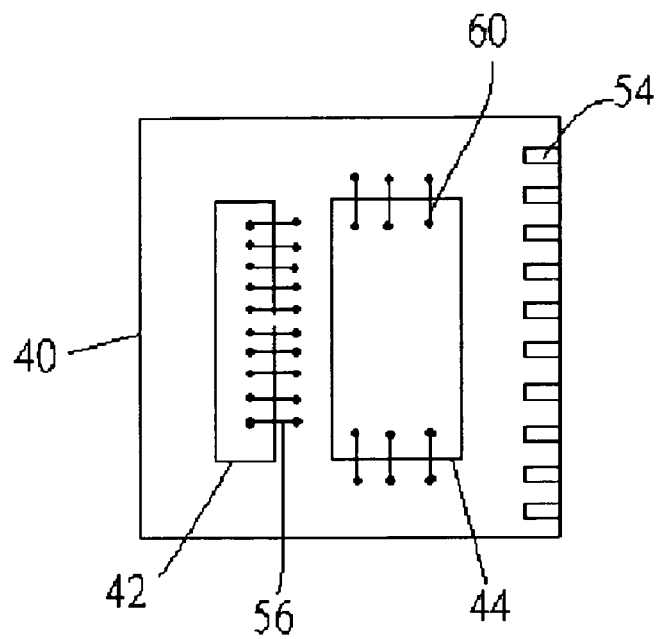
FIG. 4 is a top view of the module card structure of FIG. 3.

Please refer to FIG. 4, the second chip 44 is adhered to the upper surface 50 of the substrate 40 by adhesive layer 46, which includes glue 59 and filling elements 58, and is electrically connected to the golden fingers 54 by second wires 60. The filling elements 58 are metal balls. The adhesive layer 46 partially covers and contacts each of the bonding pads 41 to expose an exposed portion of each of the bonding pads 41, and the first wires 56 are respectively bonded to the exposed portions of the bonding pads 41.

The compound layer 48 is encapsulated on the first chip 42 and the second chip 44.

Thus, the second chip 44 is mounted on the filling elements 58, so that the wires 56 are bonded easily, and it is possible to select the substrate 40 having a smaller size to package the first chip 42 and the second chip 44 having the same original sizes. Thus, it is possible to obtain a module card structure having a smaller volume.

While the invention has been described by way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. A module card structure, comprising:
   a substrate having an upper surface on which a plurality of bonding pads and a plurality of golden fingers are formed, and a lower surface;
   a first chip mounted on the upper surface of the substrate and electrically connected to the golden fingers by first wires;
   a second chip adhered to the upper surface of the substrate by an adhesive layer, which includes glue and filling elements, and electrically connected to the golden fingers by second wires, wherein the adhesive layer partially covers and contacts each of the bonding pads to expose an exposed portion of each of the bonding pads, and the first wires are respectively bonded to the exposed portions of the bonding pads; and
   a compound layer encapsulated on the first chip and the second chip.

2. The module card structure according to claim 1, wherein the filling elements are metal balls.

* * * * *